(12) United States Patent
Tae et al.

(10) Patent No.: US 7,902,829 B2
(45) Date of Patent: Mar. 8, 2011

(54) BATTERY MANAGEMENT SYSTEM AND DRIVING METHOD THEREOF

(75) Inventors: Yong-Jun Tae, Yongin-si (KR);
Soo-Seok Choi, Yongin-si (KR);
Young-Jo Lee, Yongin-si (KR);
Han-Seok Yun, Yongin-si (KR);
Se-Wook Seo, Yongin-si (KR);
Gye-Jong Lim, Yongin-si (KR);
Beom-Gyu Kim, Yongin-si (KR);
Ho-Young Park, Yongin-si (KR)

(73) Assignee: Samsung SDI Co., Ltd. (KR)

( * ) Notice: Subject to any disclaimer, the term of this patent is extended or adjusted under 35 U.S.C. 154(b) by 489 days.

(21) Appl. No.: 11/779,164

(22) Filed: Jul. 17, 2007

(65) Prior Publication Data

US 2008/0054850 A1 Mar. 6, 2008

(30) Foreign Application Priority Data

Sep. 5, 2006 (KR) .................. 10-2006-0085198

(51) Int. Cl.
*G01N 27/416* (2006.01)
*H02J 7/00* (2006.01)
*H02H 7/18* (2006.01)
*G01R 31/36* (2006.01)

(52) U.S. Cl. ........... 324/433; 320/134; 320/104; 702/63; 307/10.7

(58) Field of Classification Search .................. 320/136, 320/134, 104, 137, 127; 307/10.7, 149, 150; 702/63; 324/426, 433

See application file for complete search history.

(56) References Cited

U.S. PATENT DOCUMENTS

| 4,937,528 A * | 6/1990 | Palanisamy ............ 324/430 |
| 5,119,011 A * | 6/1992 | Lambert ............... 320/136 |
| 6,356,083 B1 | 3/2002 | Ying |
| 6,646,419 B1 * | 11/2003 | Ying .................. 320/132 |
| 6,653,817 B2 * | 11/2003 | Tate, Jr. et al. ......... 320/132 |
| 6,850,038 B2 * | 2/2005 | Arai et al. ............ 320/132 |
| 7,317,300 B2 * | 1/2008 | Sada et al. ............ 320/136 |
| 2002/0030494 A1 * | 3/2002 | Araki et al. ........... 324/427 |

(Continued)

FOREIGN PATENT DOCUMENTS

CN 1668933 A 9/2005

(Continued)

OTHER PUBLICATIONS

Search Report issued on May 23, 2008 in corresponding European patent application No. 0711579.0 in 6 pages.

(Continued)

*Primary Examiner* — Edward Tso
*Assistant Examiner* — Alexis Boateng
(74) *Attorney, Agent, or Firm* — Knobbe Martens Olson & Bear PLC

(57) ABSTRACT

A battery management system for managing a battery including a plurality of battery cells and a driving method are provided. The system includes a sensor, and a main control unit (MCU). The sensor senses a voltage and a current of the battery. The MCU receives the voltage and the current of the battery, measures an open circuit voltage (OCV) in key-on using the battery voltage, and estimates an initial SOC depending on the OCV in the key-on. The MCU divides the OCV into first and second OCV regions, and, when the OCV in the key-on is in the first OCV region, estimates the initial SOC using a linear equation.

13 Claims, 4 Drawing Sheets

U.S. PATENT DOCUMENTS

| | | | |
|---|---|---|---|
| 2006/0038532 A1* | 2/2006 | Taniguchi | 320/103 |
| 2006/0197503 A1* | 9/2006 | Arai et al. | 320/132 |
| 2007/0080662 A1* | 4/2007 | Wu | 320/110 |
| 2007/0170892 A1* | 7/2007 | Ishii | 320/132 |
| 2007/0170893 A1* | 7/2007 | Kao et al. | 320/132 |
| 2007/0236181 A1* | 10/2007 | Palladino | 320/130 |
| 2008/0042615 A1* | 2/2008 | Serrels et al. | 320/101 |

FOREIGN PATENT DOCUMENTS

| | | |
|---|---|---|
| EP | 1 548 453 A1 | 6/2005 |
| JP | 07-063830 | 3/1995 |
| JP | 11-289685 | 10/1999 |
| JP | 2001-086604 | 3/2001 |
| JP | 2001-103614 | 4/2001 |
| JP | 2001-351698 | 12/2001 |
| JP | 2002-354703 | 12/2002 |
| JP | 2005-083970 | 3/2005 |
| JP | 2005-269760 | 9/2005 |
| JP | 2006-060946 | 3/2006 |
| JP | 2006-189385 | 7/2006 |
| KR | 1020040110029 A | 12/2004 |

OTHER PUBLICATIONS

Japanese Office Action dated Dec. 8, 2009 in corresponding Application No. 2007-114140.

Japanese Office Action dated Jun. 1, 2010 in corresponding Japanese Application No. 2007-114140.

* cited by examiner

BATTERY MANAGEMENT SYSTEM AND DRIVING METHOD THEREOF

CROSS-REFERENCE TO RELATED APPLICATION

This application claims priority to and the benefit of Korean Patent Application No. 10-2006-0085198 filed in the Korean Intellectual Property Office on Sep. 5, 2006, the entire content of which is incorporated herein by reference.

BACKGROUND

1. Field

The present invention relates to a battery management system. More particularly, the present invention relates to a battery management system used in a vehicle using electrical energy, and a driving method thereof.

2. Description of the Related Art

A vehicle using an internal combustion engine using gasoline or heavy oil as a main fuel has a serious influence on the generation of environmental pollution such as air pollution. In recent years, much effort has been made to develop an electric vehicle or a hybrid vehicle so as to reduce the generation of environmental pollution.

The electric vehicle refers to a vehicle using a battery engine that operates by an electrical energy output from a battery. The electric vehicle uses a battery in which a plurality of rechargeable secondary cells are provided as one pack as its main power source. Thus, the electric vehicle has advantages in that there is no discharge gas and a noise is very small.

The hybrid vehicle refers to an intermediary vehicle between the vehicle using an internal combustion engine and the electric vehicle. The hybrid vehicle uses two or more power sources, for example, an internal combustion engine and a battery engine. At present, the hybrid vehicle based on a hybrid type using an internal combustion engine and a fuel cell for continuously supplying hydrogen and oxygen while inducing a chemical reaction to directly obtain electrical energy or using a battery and a fuel cell is being developed.

In the vehicle using the battery engine, the number of secondary cells is gradually increasing, and a battery management system (BMS) needs a cell balancing control method for efficiently managing a plurality of connected cells for improvement of the power source.

Particularly, if a reference time is greater than an unchecked time after key-off, upon key-on, an open circuit voltage (OCV) is measured, and an initial state of charge (SOC) is estimated using a table of the SOC and the OCV. The SOC of the battery is estimated in a method in which a measured electric current is added to an electric current associated with the estimated initial SOC.

The table of the OCV and the SOC has experimental data measured through experiments under various conditions of a temperature, a current, a voltage, and a fatigue state of the battery, and is stored in a micro control unit (MCU) of the BMS. However, having a limited memory, the MCU may be overloaded since it stores the table of the OCV and the SOC obtained through measurement under the various conditions. Accordingly, it is required to distinguish a region based on a relationship of the OCV and the SOC, and differently set an initial SOC estimating method correspondingly to the distinguished region.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a battery management system and a driving method thereof having advantages of estimating an initial SOC using a linear equation.

The present invention is to provide a battery management system and a driving method thereof, for estimating an initial SOC using a linear equation.

A battery management system comprising a plurality of battery cells comprises a voltage and current sensor and a main controller.

The voltage and current sensor for the battery generates voltage and current signals concerning the battery.

The main controller receives the voltage and current signals from the sensor, and is configured to: (a) measure a key-on open circuit voltage (OCV) using the battery voltage signal, (b) determine whether the key-on OCV belongs to a first OCV region, and (c) estimate an initial state of charge (SOC) of the battery using a linear equation when the key-on OCV belongs to the first OCV region.

The main controller may be further configured to calculate a key-off time based on the latest two key-on times and to compare the key-off time with a reference time. When the key-off time is longer than the reference time, the main controller determines whether the key-on OCV belongs to the first OCV region. The linear equation may be obtained experimentally.

The main controller may estimate the initial SOC using a table of OCV and SOC when the key-on OCV belongs to a second OCV region. The table may comprise experimental data obtained by experiments under a plurality of conditions. The plurality of conditions may comprise temperature, current, voltage, and fatigue state of the battery. The table may be stored in the main controller, and the main controller further comprises a storage unit. The storage unit may comprise a nonvolatile memory, and the nonvolatile memory may comprise an electrically erasable programmable read only memory (EEPROM).

When the key-off time is shorter than the reference time, the main controller may estimate the initial SOC of the battery to be substantially identical to a key-off SOC. The reference time comprises a time taken for the OCV in the key-on to reach a stabilization state.

The sensor may be further configured to sense temperature and terminal voltage of the battery. The sensor comprises a Hall current transformer and a shunt resistor.

The main controller may comprise: a timer; a controller; and a storage unit. The timer may be configured to measure key-on time and key-off time and to transmit the measured key-on and key-off times to the storage unit. The controller may receive the voltage and the current of the battery from the sensor, measure the key-on OCV, control the timer and the storage unit, and estimate the initial SOC.

A method of estimating an initial state of charge (SOC) of a battery comprises: (a) sensing voltage and current from the battery to obtain voltage and current signals; (b) measuring a key-on open circuit voltage (OCV) using the voltage signal; (c) determining whether the key-on OCV belongs to a first OCV region; and (d) estimating the initial SOC using a linear equation when the key-on OCV belongs to the first OCV region.

Step (c) may comprise: comparing a key-off time of the battery with a reference time; and determining the key-on OCV to be in the first OCV region when the key-off time is longer than the reference time.

When the key-off time is longer than the reference time, the key-on OCV is in a second region, and the initial SOC is estimated using a table of OCV and SOC. When the key-off time is shorter than the reference time the initial SOC is estimated to be substantially identical to a key-off SOC. The reference time may comprise a time taken for the OCV in the key-on to reach a stabilization state.

An exemplary embodiment of the present invention provides a battery management system for managing a battery including a plurality of battery cells. The system includes a sensor, and a main control unit (MCU). The sensor senses a voltage and a current of the battery.

The MCU receives the voltage and the current of the battery, measures an open circuit voltage (OCV) in key-on using the battery voltage, and estimates an initial SOC depending on the OCV in key-on.

The MCU divides the OCV into first and second OCV regions, and, when the OCV in key-on is in the first OCV region, estimates the initial SOC using a linear equation.

The linear equation may be obtained corresponding to the first OCV region where the OCV and the SOC have a linear relationship.

When the OCV in key-on is in the second OCV region, the MCU may estimate the initial SOC using a table of the OCV and the SOC.

Another embodiment of the present invention provides a driving method of a battery management system for managing a battery including a plurality of battery cells.

The method includes: comparing a key-off time of the battery with a reference time; measuring an OCV in key-on when the key-off time is greater than the reference time as the comparison result; determining whether or not the OCV in key-on is in the first OCV region; and estimating the initial SOC using a linear equation when the OCV in key-on is in the first OCV region as the determination result.

The method may further include, in the measuring of the OCV, estimating an SOC in key-off just before key-on as the initial SOC when the key-off time is less than the reference time as the comparison result.

The method may further include, in the estimating of the initial SOC, estimating the initial SOC using the table of the OCV and the SOC when the OCV in key-on is not in the first OCV region as the determination result.

The linear equation may be obtained corresponding to the first OCV region where the OCV and the SOC have a linear relationship. The reference time may be a time taken for the OCV in key-on to reach a stabilization state.

DETAILED DESCRIPTION OF THE EMBODIMENTS

Figure 1:
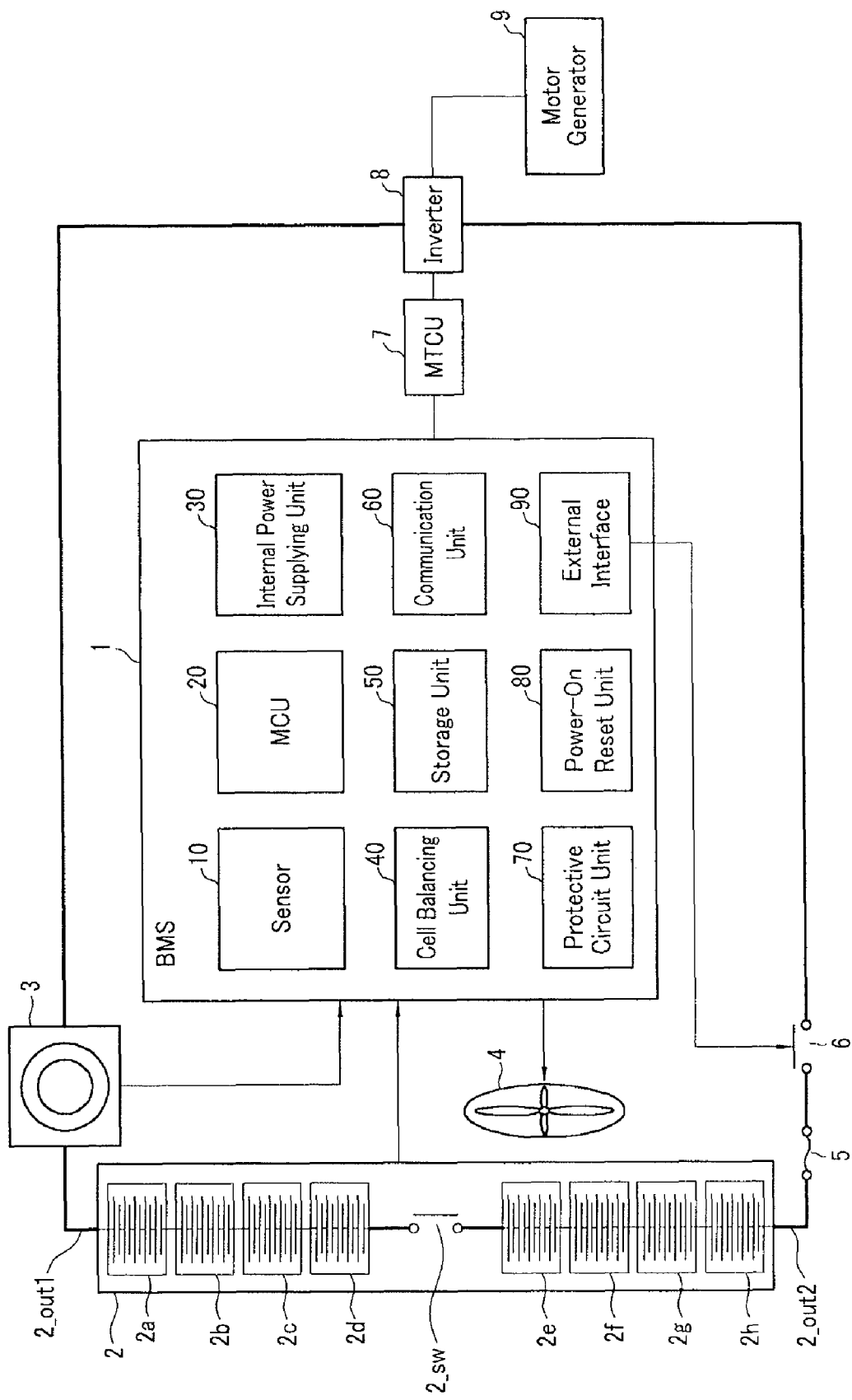
FIG. 1 is a schematic diagram illustrating a battery, a battery management system (BMS), and peripheral devices of the BMS according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In a whole specification, "connecting" any part with another part not only includes "direct connecting", but also includes "electrically connecting" with a different constituent element interposed therebetween. Also, "including" a constituent element in a part signifies further including, not excluding, another constituent element if there is no specific reference to the contrary.

FIG. 1 is a schematic diagram illustrating a battery, a battery management system (BMS), and peripheral devices of the BMS according to an exemplary embodiment of the present invention As shown in FIG. 1, a vehicle system includes the BMS 1, the battery 2, an electric current sensor 3, a cooling fan 4, a fuse 5, a main switch 6, a motor control unit (MTCU) 7, an inverter 8, and a motor generator 9.

The battery 2 includes: a plurality of sub-packs $2a$ to $2h$ in which a plurality of battery cells are coupled in series; output terminals (2_OUT and 2_OUT2); and a safety switch (2_SW) provided between the sub-pack $2d$ and the sub-pack $2e$. The sub-packs $2a$ to $2h$ are exemplarily provided eight in number, and the sub-packs are merely to indicate the plurality of battery cells in one group, and are not intended to limit the scope of the present invention. The safety switch (2_SW) refers to a switch provided between the sub-pack $2d$ and the sub-pack $2e$. The safety switch (2_SW) can be manually switched on/off for the sake of a worker's safety when the battery is replaced or a work is executed for the battery. In an exemplary embodiment of the present invention, the safety switch (2_SW) is provided between the sub-pack $2d$ and the sub-pack $2e$, but it is not intended to limit the scope of the present invention. The output terminals (2_OUT1 and 2_OUT2) connect to the inverter 8.

The electric current sensor 3 measures an amount of electric current output from the battery 2, and outputs the measured current amount to a sensor 10 of the BMS 1. The electric current sensor 3 can be a hall current transformer (CT) for measuring the current using a Hall device and outputting an analog current signal associated with the measured current, or a shunt resistor for outputting a voltage signal corresponding to an electric current flowing through a resistor inserted into a load line.

The cooling fan 4 dissipates a heat caused by charging and discharging the battery 2 on the basis of a control signal of the BMS 1, thereby preventing the battery 2 from being degenerated due to an increase of temperature, and efficiency of the charge and discharge from being reduced.

The fuse 5 disconnects or short-circuits the battery 2, thereby preventing an overcurrent from being transmitted to the battery 2. In other words, when the overcurrent is generated, the fuse 5 is disconnected, thereby preventing the overcurrent from being transmitted to the battery 2.

When an abnormal overvoltage, overcurrent, or high temperature is generated, the main switch 6 switches on/off the battery 2 on the basis of a control signal of the BMS 1 or the MTCU 7 of the vehicle.

The BMS 1 includes the sensor 10, a main control unit (MCU) 20, an internal power supplying unit 30, a cell balancing unit 40, a storage unit 50, a communication unit 60, a protective circuit 70, a power-on reset unit 80, and an external interface 90.

The sensor 10 senses and transmits an entire battery pack current (hereinafter, referred to as "pack current"), an entire battery pack voltage (hereinafter, referred to as "pack voltage"), a pack temperature, a battery terminal voltage (Vt), and a battery temperature (T) to the MCU 20.

The MCU 20 divides the OCV region into a first OCV region and second OCV regions (I and II) depending on the relationship of the OCV and the SOC. According to an exemplary embodiment of the present invention, the first OCV region refers to an OCV region where the OCV and the SOC have a linear relationship, and the initial SOC is estimated using a linear equation. The second OCV regions (I and II) refer to OCV regions where the OCV and the SOC have a nonlinear relationship, and the initial SOC is estimated using the table of the OCV and the SOC. Sensing a key-on state, the MCU 20 calculates a key-off time until key-on is again performed after key-off. The MCU 20 compares the key-off time with a reference time. According to an exemplary embodiment of the present invention, the reference time refers to a time taken for the OCV in the key-on to reach a stabilization state. When the key-off time is less than the reference time as the comparison result, the MCU 20 trusts an SOC in the key-off just before the key-on, and estimates the trusted SOC as the initial SOC. However, when the key-off time is greater than the reference time as the comparison result, the MCU 20 measures the OCV in the key-on using the battery voltage received from the sensor 10, and determines whether or not the OCV in the key-on is in the first OCV region. Determining that the OCV in the key-on is in the first OCV region, the MCU 20 estimates the initial SOC using the linear equation. Determining that the OCV in the key-on is not in the first OCV region, that is, is in the second OCV regions (I and II), the MCU 20 estimates the initial SOC using the table of the OCV and the SOC.

The internal power supplying unit 30 supplies a power source to the BMS 1 using a sub-battery. The cell balancing unit 40 balances the state of charge of each cell. In other words, the cell balancing unit 40 can discharge a cell of a relatively high charged state, and can charge a cell of a relatively low charged state. The storage unit 50 stores data of the SOC and the state of health (SOH) when the BMS 1 is in a power-off state. The storage unit 50 can be a nonvolatile storage unit that is an electrically erasable programmable read only memory (EEPROM). The communication unit 60 communicates with the MTCU 7 of the vehicle. The communication unit 60 transmits information on the SOC and the SOH from the BMS 1 to the MTCU 7, or receives information on the vehicle state from the MTCU 7 and transmits the received information to the MCU 20. The protective circuit 70 refers to a secondarily added circuit to protect the battery 2 from overcurrent and overvoltage, using hardware. Before that, the protective circuit 70 primarily protects the battery 2, using firmware provided within the MCU 20. The power-on reset unit 80 resets the entire system when the BMS 1 is in a power-on state. The external interface 90 connects peripheral devices of the BMS 1, such as the cooling fan 4 and the main switch 6, to the MCU 20. In an exemplary embodiment of the present invention, only the cooling fan 4 and the main switch 6 are shown as the peripheral devices but are not intended to limit the scope of the present invention.

The MTCU 7 detects an in-running state of the vehicle on the basis of information such as an accelerator, a brake, and a speed of the vehicle, and decides necessary information such as a degree of torque. The in-running state of the vehicle refers to a key-on state for starting the engine, a key-off state for stopping the engine, a dependent running state, and an acceleration running state. The MTCU 7 transmits the information on the vehicle state to the communication unit 60 of the BMS 1. The MTCU 7 controls the motor generator 9 to have an output based on torque information. In other words, the MTCU 7 controls switching of the inverter 8, and controls the motor generator 9 to have the output based on the torque information. The ECU 7 receives the SOC of the battery 2 from the MCU 20 through the communication unit 60 of the BMS 1, and controls the SOC of the battery 2 to reach a target value (e.g., 55%). For example, receiving the SOC by 55% or less from the MCU 20, the MTCU 7 controls a switch of the inverter 8 to output a power toward the battery 2, thereby charging the battery 2. At this time, the pack current (Ip) has a negative (−) value. Receiving the SOC by 55% or more, the MTCU 7 controls the switch of the inverter 8 to output the power toward the motor generator 9, thereby discharging the battery 2. At this time, the pack current (Ip) has a positive (+) value.

The inverter 8 enables the battery 2 to be charged or discharged on the basis of the control signal of the MTCU 7.

The motor generator 9 drives the vehicle on the basis of the torque information received from the MTCU 7, using the electrical energy of the battery 2.

As a result, the MTCU 7 charges and discharges the battery 2 as much as a rechargeable power on the basis of the SOC, thereby preventing the battery 2 from being overcharged and overdischarged and making it possible to efficiently use the battery 2 for a long time. However, when the battery 2 is installed in the vehicle, it is difficult to measure an actual SOC of the battery 2. Therefore, the BMS 1 should accurately estimate the SOC, using the pack current (Ip), the pack voltage (Vp), and the cell temperature sensed in the sensor 10, and transmit the estimated SOC to the MTCU 7.

A method for estimating the initial SOC of the battery according to an exemplary embodiment of the present invention will be described in detail with reference to FIGS. 2 to 4 below.

Figure 2:
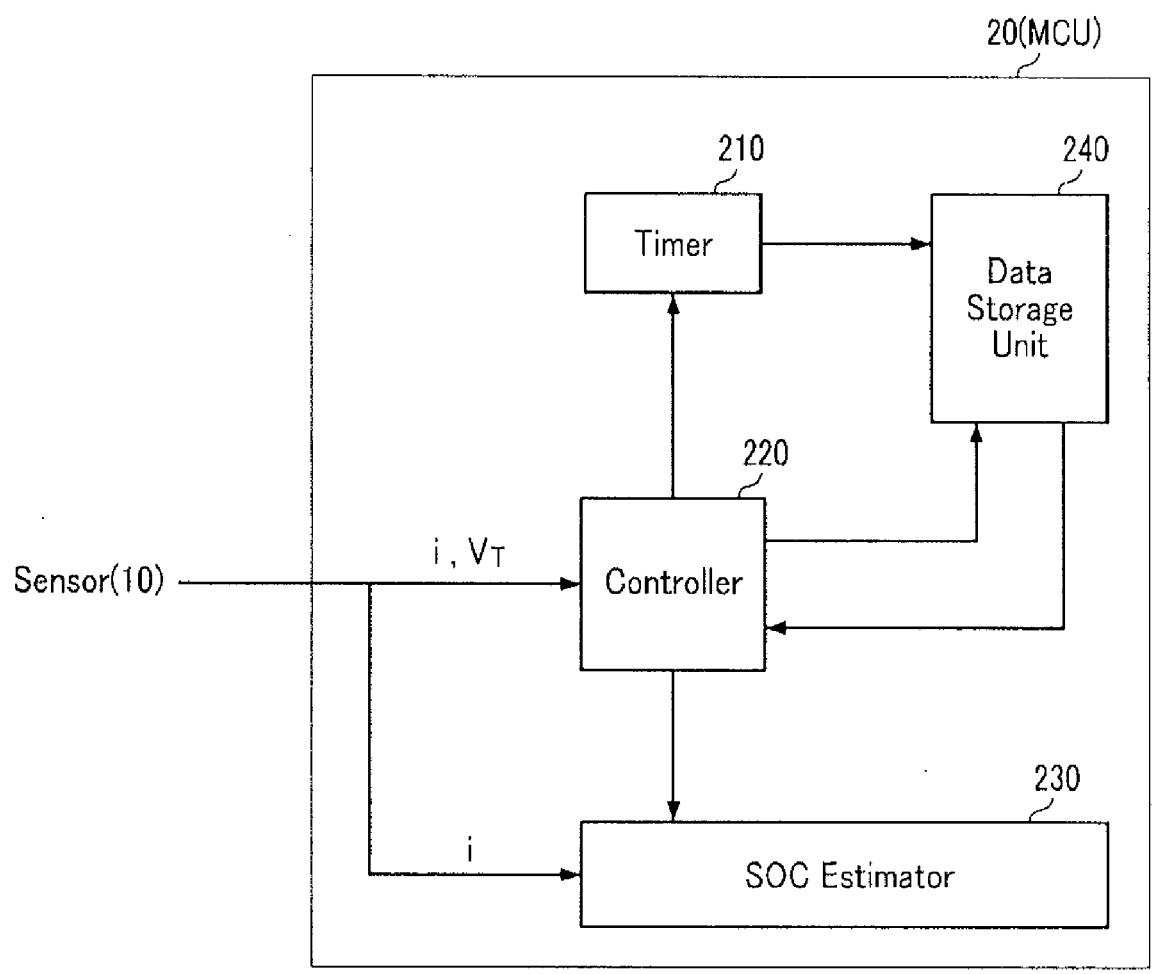
FIG. 2 is a schematic diagram illustrating a micro control unit (MCU) 20 according to an exemplary embodiment of the present invention.

FIG. 2 is a schematic diagram illustrating the MCU 20 according to an exemplary embodiment of the present invention.

As shown in FIG. 2, the MCU 20 includes a timer 210, a controller 220, an SOC estimator 230, and a data storage unit 240.

The timer 210 measures and transmits key-on and key-off times to the data storage unit 240.

The controller 220 receives the voltage and the current of the battery from the sensor 10, and measures the OCV in key-on using the received battery voltage. The controller 220 controls the timer 210, the SOC estimator 230, and the data storage unit 240, and estimates the initial SOC correspondingly to the first OCV region and the second OCV regions (I and II) that are divided depending on the relationship of the OCV and the SOC.

A method for estimating the initial SOC of the battery in the controller 220 will be described in detail below. Sensing a key-on state of starting the engine, the controller 220 receives key-on and key-off times from the data storage unit 240. Then, the controller 220 calculates the key-off time until the key-on is again performed after the key-off. The controller 220 compares the calculated key-off time with the reference time. When the key-off time is less than the reference time as the comparison result, the controller 220 trusts the SOC in the key-off just before the key-on, and estimates the trusted SOC as the initial SOC. The controller 220 transmits the calculated initial SOC to the SOC estimator 230. However, when the key-off time is greater than the reference time as the comparison result, the controller 220 measures the OCV in the key-on using the received battery voltage. The controller 220 determines whether or not the OCV in the key-on is in the first OCV region. Determining that the OCV in the key-on is in the first OCV region, the controller 220 estimates the initial SOC using the linear equation. According to an exemplary embodiment of the present invention, the linear equation can be a simple equation obtained corresponding to the first OCV region where the OCV and the SOC have a linear relationship in the relation table of the OCV and the SOC, which is obtained through various experiments. The linear equation is used for estimating the initial SOC corresponding to the first OCV region. However, when determining that the OCV in the key-on is not in the first OCV region, that is, is in the second OCV regions (I and II), the controller 220 estimates the initial SOC using the table of the OCV and the SOC. The controller 220 transmits the initial SOC estimated in the first and second OCV regions, to the SOC estimator 230.

The SOC estimator 230 adds the current (i) of the battery to an electric current associated with the initial SOC received from the controller 220, thereby estimating the SOC.

The data storage unit 240 stores battery state information in key-on and key-off. In other words, the data storage unit 240 stores the key-on and key-off times, and stores the SOC in the key-off just before the key-on. The data storage unit 240 stores the table of the OCV and the SOC, which is measured through experiments under various conditions of the temperature, the current, the voltage, and the fatigue state of the battery.

Figure 3:
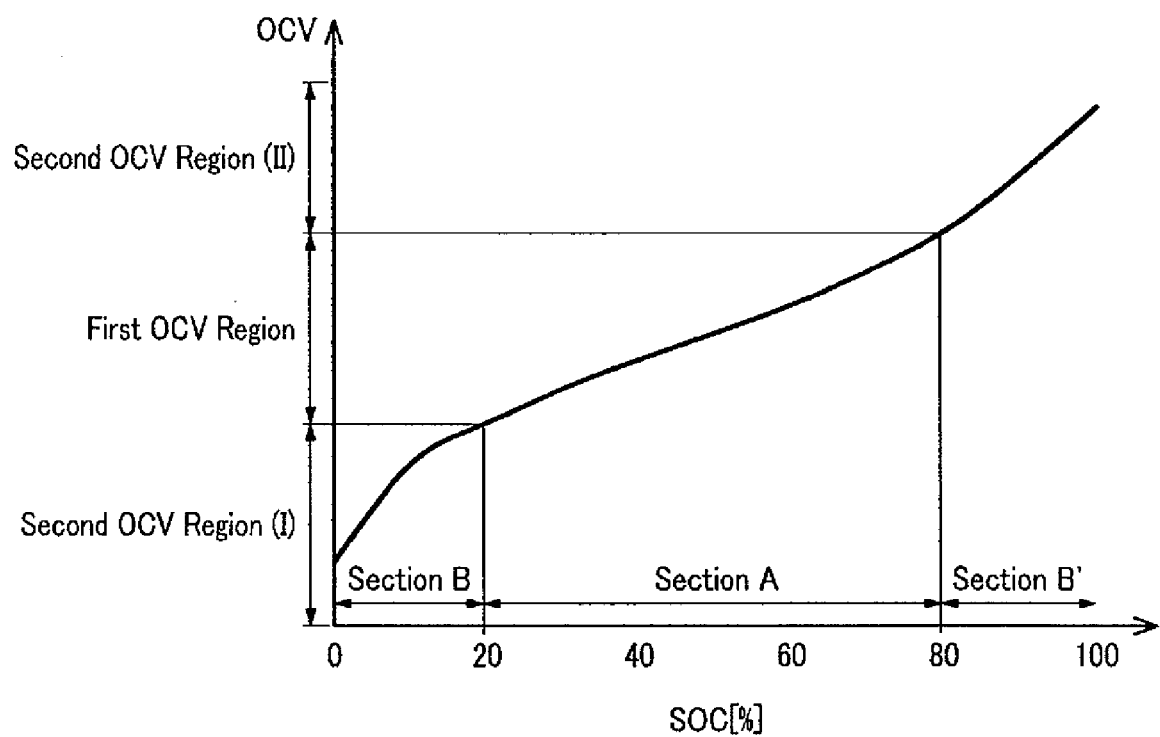
FIG. 3 is a graph showing a relationship of an open circuit voltage (OCV) and a state of charge (SOC) according to an exemplary embodiment of the present invention.

FIG. 3 is a graph showing the relationship of the OCV and the SOC according to an exemplary embodiment of the present invention.

As shown in FIG. 3, the OCV region is divided into the first OCV region and the second OCV regions (I and II) in the graph showing the relationship of the OCV and the SOC. A reference for distinguishing the first and second OCV regions is decided depending on a section where the OCV and the SOC maintain the linear relationship. According to an exemplary embodiment of the present invention, the first OCV region is set as the section where the OCV and the SOC have the linear relationship, and the second OCV regions (I and II) are set as the sections where the OCV and the SOC have the nonlinear relationship. When an entire SOC section is set as 0% to 100%, the entire SOC is divided into, and set as, a section B (0% to 20%), a section A (20% to 80%), and a section B' (80% to 100%). The first OCV region has the linear relationship in the section A (20% to 80%). The SOC associated with the OCV of the first OCV region can be estinated using the linear equation. In detail, when the OCV in key-on is included in the first OCV region, the initial SOC associated with the OCV in key-on can be estimated using the linear equation. The second OCV regions (I and II) have the nonlinear relationships as the section B (0% to 20%) and the section B' (80% to 100%), respectively. The SOC corresponding to the second OCV regions (I and II) can be estinated using the table of the OCV and the SOC.

Figure 4:
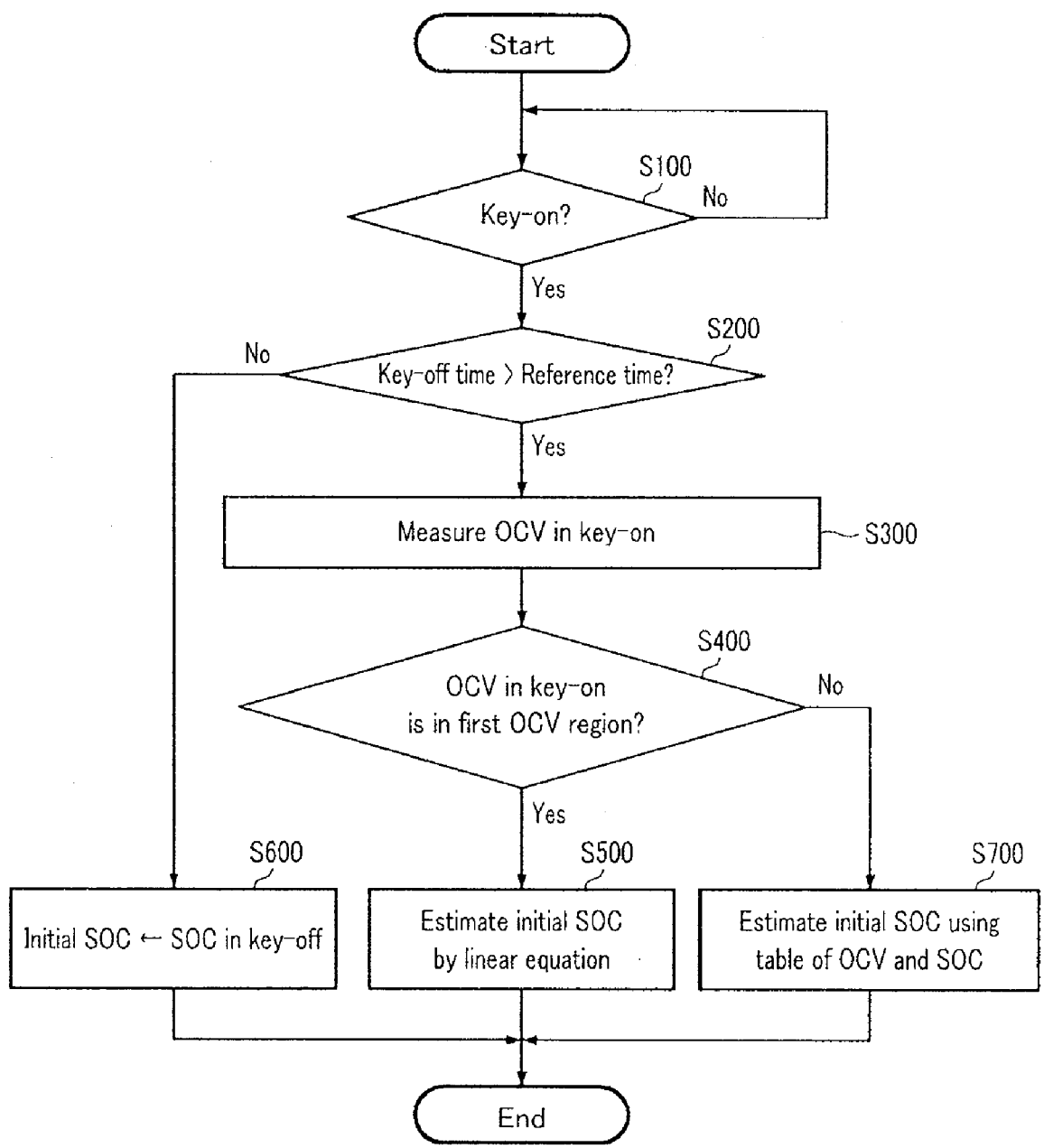
FIG. 4 is a flowchart illustrating a method for estimating an initial SOC of a battery according to an exemplary embodiment of the present invention.

FIG. 4 is a flowchart illustrating a method for estimating the initial SOC of the battery according to an exemplary embodiment of the present invention.

The MCU 20 determines whether or not it is in the key-on state (step S100).

When it is determined that it is not in the key-on state, the step S100 is repeated. When it is determined that it is in the key-on state, the MCU 20 receives the key-on and key-off times from the data storage unit 240, calculates the key-off time, and compares the calculated key-off time with the reference time (step S200).

When the key-off time is less than the reference time as the comparison result, the MCU 20 estimates the SOC in the key-off just before the key-on, as the initial SOC (step S600). When the key-off time is greater than the reference time as the comparison result, the MCU 20 measures the OCV in the key-on using the voltage of the battery (step S300). The MCU 20 determines whether or not the OCV in the key-on is in the first OCV region (step S400).

When it is determined that the OCV in the key-on is in the first OCV region as the result of the step S400, the MCU 20 estimates the initial SOC using the linear equation (step S500). When it is determined that the OCV in the key-on is not in the first OCV region, that is, is in the second OCV regions (I and II) as the result of the step S400, the MCU 20 estimates the initial SOC using the table of the OCV and the SOC (step S700).

As above, according to an exemplary embodiment of the present invention, the initial SOC can be estimated using the linear equation in the section where the OCV and the SOC have the linear relationship. Accordingly, since the initial SOC is estimated using the linear equation, an amount of a memory held by the table of the OCV and the SOC can be reduced in the MCU 20, and the MCU 20 can be more effectively used.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

In the battery management system and the driving method thereof according to an exemplary embodiment of the present invention, the initial SOC can be estimated using the linear equation in the section where the OCV and the SOC have the linear relationship.

What is claimed is:

1. A battery management system comprising a plurality of battery cells, the system comprising:
   a voltage and current sensor for the battery that generates voltage and current signals concerning the battery; and
   a main controller that receives the voltage and current signals from the sensor and is configured to: (a) measure a key-on open circuit voltage (OCV) using the battery voltage signal, (b) determine whether the key-on OCV belongs to a first OCV region or a second OCV region, and (c) estimate an initial state of charge (SOC) of the battery using a linear equation when the key-on OCV belongs to the first OCV region;
   wherein the main controller is further configured to calculate the key-off time period, the key-off time period being an amount of time that the battery has been in a key-off state from a key-off time point to a time point at which the present key-on state begins, and to compare the key-off time with a reference time; and
   wherein when the key-off time is longer than the reference time the main controller determines whether the key-on OCV belongs to the first OCV region.

2. The system of claim 1, wherein the linear equation is obtained experimentally.

3. The system of claim 1, wherein the main controller estimates the initial SOC using a table of OCV and SOC when the key-on OCV belongs to the second OCV region.

4. The system of claim 1, wherein when the key-off time is shorter than the reference time the main controller estimates the initial SOC of the battery to be substantially identical to a key-off SOC.

5. The system of claim 1, wherein the reference time comprises a time taken for the OCV in the key-on to reach a stabilization state.

6. The system of claim 1, wherein the sensor is further configured to sense temperature and terminal voltage of the battery.

7. The system of claim 1, wherein the main controller comprises:
- a timer;
- a controller; and
- a storage unit.

8. The system of claim 7, wherein the timer is configured to measure key-on time and key-off time and to transmit the measured key-on and key-off times to the storage unit.

9. The system of claim 7, wherein the controller receives the voltage and the current of the battery from the sensor, measures the key-on OCV, controls the timer and the storage unit, and estimates the initial SOC.

10. A method of estimating an initial state of charge (SOC) of a battery, comprising:
    (a) sensing voltage and current from the battery to obtain voltage and current signals;
    (b) measuring a key-on open circuit voltage (OCV) using the voltage signal;
    (c) determining whether the key-on OCV belongs to a first OCV region or a second OCV region; and
    (d) estimating the initial SOC using a linear equation when the key-on OCV belongs to the first OCV region;
    wherein step (c) comprises:
        comparing a key-off time of the battery with a reference time; and
        determining the key-on OCV to be in the first OCV region when the key-off time is longer than the reference time.

11. The method of claim 10, wherein when the key-off time is longer than the reference time, the key-on OCV is in the second OCV region, and the initial SOC is estimated using a table of OCV and SOC.

12. The method of claim 10, wherein when the key-off time is shorter than the reference time the initial SOC is estimated to be substantially identical to a key-off SOC.

13. The method of claim 10, wherein the reference time comprises a time taken for the OCV in the key-on to reach a stabilization state.

* * * * *